(12) United States Patent
Majumdar et al.

(10) Patent No.: US 6,529,062 B2
(45) Date of Patent: Mar. 4, 2003

(54) POWER MODULE

(75) Inventors: Gourab Majumdar, Tokyo (JP);
Mitsutaka Iwasaki, Tokyo (JP); Shinji Hatae, Tokyo (JP); Fumitaka Tametani, Tokyo (JP); Toru Iwagami, Tokyo (JP); Akihisa Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/767,226

(22) Filed: Jan. 23, 2001

(65) Prior Publication Data

US 2002/0030532 A1 Mar. 14, 2002

(30) Foreign Application Priority Data

Jul. 28, 2000 (JP) ........................ 2000-228863

(51) Int. Cl.⁷ ............................. H03K 17/687
(52) U.S. Cl. ................... 327/434; 327/435; 327/565
(58) Field of Search ................ 327/427, 430, 327/432, 434, 435, 565; 257/718; 318/803, 801; 363/132, 55

(56) References Cited

U.S. PATENT DOCUMENTS

| | | | |
|---|---|---|---|
| 4,947,234 A | 8/1990 | Einzinger et al. | ............. 357/68 |
| 5,253,156 A | 10/1993 | Sakurai et al. | ............. 363/98 |
| 5,920,119 A * | 7/1999 | Tamba et al. | ............. 257/718 |
| 6,057,728 A * | 5/2000 | Igarashi | ............. 327/546 |
| 6,215,679 B1 * | 4/2001 | Yamane et al. | ............. 363/132 |

FOREIGN PATENT DOCUMENTS

| | | |
|---|---|---|
| JP | 63-87758 | 4/1988 |
| JP | 3-226291 | 10/1991 |
| JP | 6-181286 | 6/1994 |

* cited by examiner

Primary Examiner—Tuan T. Lam
Assistant Examiner—Hiep Nguyen
(74) Attorney, Agent, or Firm—Oblon, Spivak, McClelland, Maier & Neustadt, P.C.

(57) ABSTRACT

A power module is provided with an insulating substrate with a heat sink being bonded to one surface thereof and a circuit pattern being formed on the other surface. The circuit pattern is formed by an electrode layer. A switching semiconductor element and a free wheeling diode that is connected to a switching semiconductor element in anti-parallel therewith are placed on the circuit pattern. A controlling IC for controlling the switching semiconductor element is placed on the free wheeling diode. Thus, it is possible to make the entire power module compact, and it becomes possible to provide an inexpensive power module which can prevent the controlling IC from malfunctioning due to heat generated by the switching semiconductor element.

8 Claims, 5 Drawing Sheets

POWER MODULE

BACKGROUND OF THE INVENTION

1. Field of the Invention

The present invention relates to a semiconductor device including a switching semiconductor element and a controlling IC for controlling the switching semiconductor element, and more specifically concerns a power module.

2. Description of the Related Art

Figure 6:
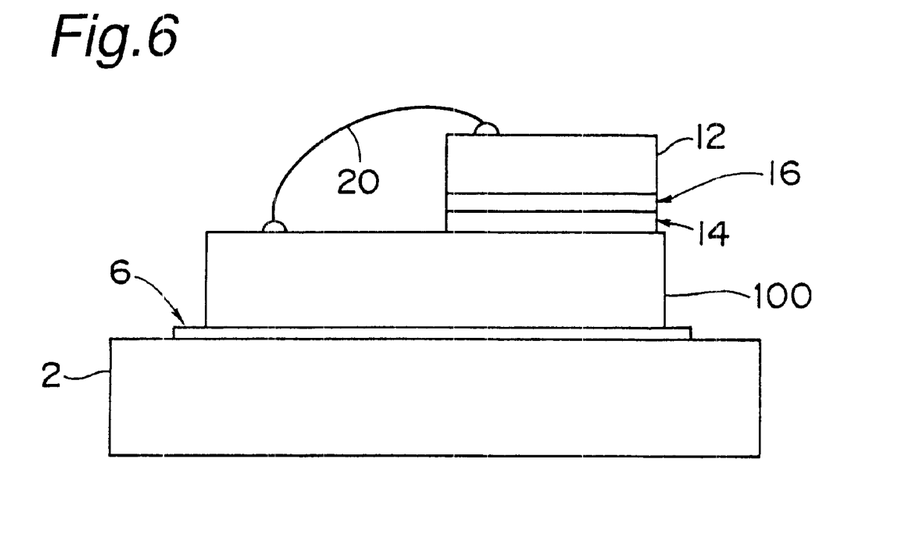
FIG. 6 is an explanatory drawing that explains the construction of a conventional power module.
Figure 7:
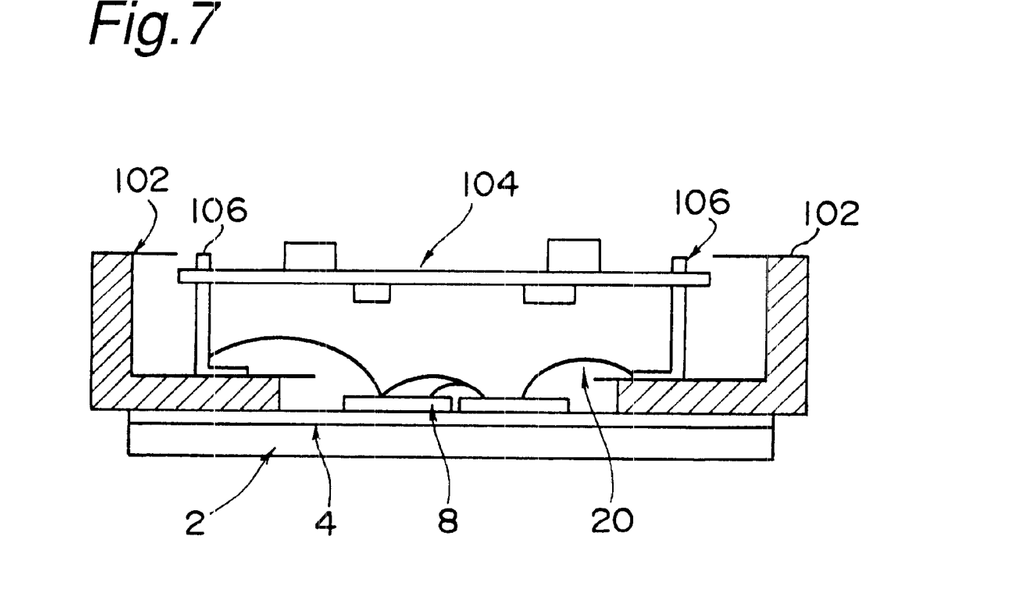
FIG. 7 is another explanatory drawing that explains the construction of the conventional power module.
Figure 8:
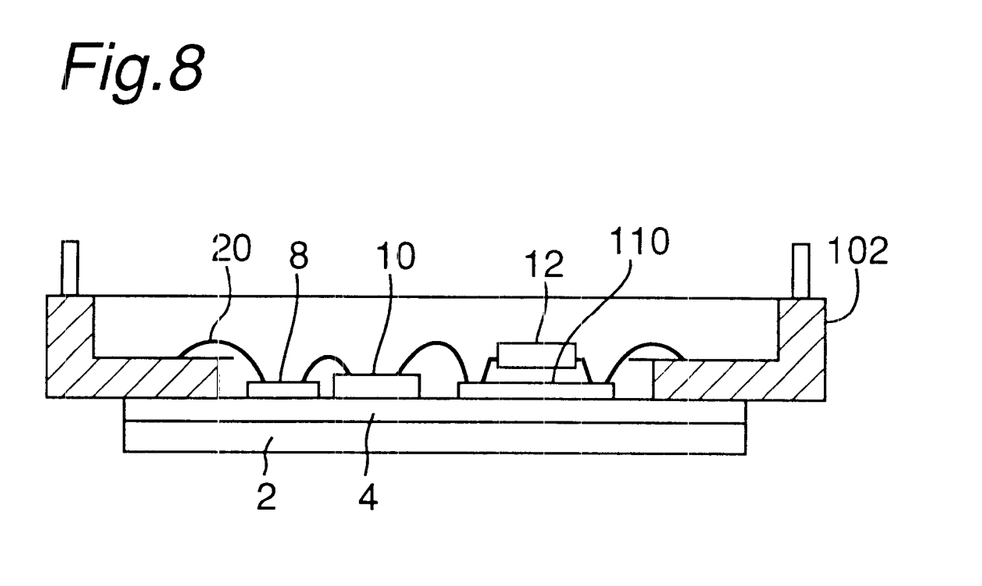
FIG. 8 is still another explanatory drawing that explains the construction of the conventional power module.

Conventionally, an intelligent power module (IPM) containing a power circuit constituted by a switching semiconductor element and a control circuit for controlling the power circuit has a construction in which the power circuit and the control circuit constituted by an integrated circuit (IC) serving as a controlling IC are formed in a separated manner as two stages (FIG. 7), or the control circuit and the power circuit are integrally formed on one substrate (FIGS. 6 and 8).

Moreover, a power module shown in FIG. 6 has a construction in which an MOSFET (metal oxide semiconductor field effect transistor) 100 is connected to an electrode layer 6 on a heat sink 2 and a controlling IC 12 is bonded thereto by a bonding agent layer 16 through an insulating layer 14 on the MOSFET 100.

Here, a power module shown in FIG. 8 has a construction in which a switching semiconductor element 8, a FWDi 10, a printed substrate 110 and a case 102 are formed on an insulating substrate 4 on a heat sink 2. A controlling IC 12 is assembled on the printed substrate 110. The FWDi 10 is connected to the switching semiconductor element 8 and the printed substrate 110 by bonding wires 20. The switching semiconductor element 8 and the printed substrate 110 are connected to terminals, not shown, on the case 102, by respective bonding wires 20.

A power module, shown in FIG. 7, has an arrangement in which a switching semiconductor element 8 and a case 102 are placed on an insulating substrate 4 bonded to a heat sink 2, and a control substrate 104, supported by a relay terminal 106 on the case 102, is installed. Here, the switching semiconductor element 8 is connected to a relay terminal 106 by a bonding wire 20. The control substrate 104 contains a controlling IC for controlling the switching semiconductor element 8, etc. The relay terminal 106 is used so as to transmit driving input signals, driving output signals, detection signals for current, voltage and temperature, etc. of the switching semiconductor element between the switching semiconductor element 8 and the controlling IC on the control substrate 104.

Moreover, with respect to a semiconductor device having a construction in which a control circuit constituted by semiconductor elements, and a power circuit, etc. are integrally formed, Japanese Laid-Open Patent Publications No. 6-181286, No. 63-87758, No. 3-226291, No. 11-163256 and No. 8-167838 have disclosed such a construction.

Japanese Laid-Open Patent Publication No. 6-181286 discloses a semiconductor device having a construction in which a controlling IC chip is bump-connected onto a power IC chip fixed to a heat sink through a thin-film substrate.

Japanese Laid-Open Patent Publication No. 63-87758 discloses a semiconductor device having a construction in which a controlling IC is joined to a power MOSFET fixed to a heat sink.

Japanese Laid-Open Patent Publication No. 3-226291 discloses a semiconductor device having a construction in which an IGBT (insulated gate bipolar transistor), an FWDi (Free Wheeling Diode) and a controlling IC are formed into one chip.

Japanese Laid-Open Patent Publication No. 11-163256 discloses a semiconductor device having a construction in which on a semiconductor chip on a heat radiation plate is superposed another semiconductor chip, that is, a so-called chip-on-chip construction, and Japanese Laid-Open Patent Publication No. 8-167838 discloses a semiconductor device having a construction in which a plurality of power-MOSFETs and a control circuit are integrated as one chip.

SUMMARY OF THE INVENTION

For example, in a structure of a semiconductor device shown in FIG. 6, in the case when a controlling IC 12 is attached to an MOSFET 100 (IGBT or power MOSFET) by means of a bump, an insulating layer 14, a bonding-agent layer 16 or a press-joining, etc., a problem arises in which the controlling IC malfunctions due to heat generated by the switching semiconductor element 8. Here, MOSFET 100 serves as the switching semiconductor element constituted by a power circuit. Moreover, in the case when the controlling IC 12 is packaged inside the switching semiconductor element 8 also, the same problem arises in which the controlling IC malfunctions due to heat generated by the switching semiconductor element 8. Therefore, the problem with the semiconductor devices having the constructions disclosed in Japanese Laid-Open Patent Publications No. 6-181286 and No. 63-87758 is that the controlling IC is susceptible to malfunctions due to heat.

Moreover, in the semiconductor device disclosed by Japanese Laid-Open Patent Publication No. 3-226291 also, a problem arises in which the controlling IC malfunctions due to heat generated by the IGBT, depending on the positional relationship between the IGBT and the controlling IC.

Furthermore, as illustrated in FIG. 7, in the case when, in a power module, the MOSFET or the IGBT serving as a switching semiconductor elements 8, the FWDi 10 (Free Wheeling Diode) and the controlling IC 12, etc. are constructed in a separated manner, the number of parts related to the construction increases and the construction becomes complex, resulting in high costs in the module per unit. Another problem is that the power module as a whole becomes comparatively large.

In the case of the power module shown in FIG. 8 also, a problem arises in which the power module as a whole becomes comparatively large.

The present invention has been devised to solve the above-mentioned problems, and its objective is to make the power module as a whole compact, and to provide an inexpensive power module which can prevent malfunction of the controlling IC due to heat generated by the switching semiconductor element, while maintaining resistance to switching noise from the switching semiconductor element.

The power module of the first aspect of the present invention, which has been devised to solve the above-mentioned problems, is provided with an insulating substrate having a base plate bonded to one of faces thereof and a circuit pattern formed on the other face as an electrode layer, the circuit pattern including: a switching semiconductor element, a free wheeling diode connected to the switching semiconductor element in anti-parallel therewith, and a controlling IC for controlling the switching semiconductor element, and in this arrangement, the controlling IC is formed on the free wheeling diode.

In accordance with the power module of the first aspect of the invention, since the controlling IC is placed on the FWDi which generates less heat upon operation than the switching semiconductor element it is possible to prevent the controlling IC from malfunctioning due to heat generated by the switching element. Therefore, it becomes possible to improve reliability of the power module.

The power module of the second aspect of the present invention, which relates to the power module of the first aspect, is characterized in that the switching semiconductor element and the free wheeling diode are constructed as a monolithic integrated circuit.

In accordance with the power module of the second aspect of the present invention, the switching semiconductor element and the free wheeling diode are constituted as a monolithic integrated circuit; therefore, it is possible to make the power module compact, and also to simplify the construction thereof. Thus, it becomes possible to increase the productivity in the wafer manufacturing process and the assembling process of the semiconductor, and consequently to reduce the unit price of the power module.

The power module of the third aspect of the present invention is provided with an insulating substrate having a base plate bonded to one of faces thereof and a circuit pattern formed on the other face as an electrode layer, the circuit pattern including: a switching semiconductor element, a free wheeling diode connected to the switching semiconductor element in anti-parallel therewith, and a controlling IC for controlling the switching semiconductor element, the switching semiconductor element, and in this arrangement, the free wheeling diode, the switching semiconductor element and the controlling IC are constructed as a monolithic integrated circuit with at least one portion of the free wheeling diode being sandwiched between the switching semiconductor element and the controlling IC.

In accordance with the power module of the third aspect of the present invention, the switching semiconductor element, the free wheeling diode and the controlling IC are constituted as a monolithic integrated circuit; therefore, it is possible to make the entire power module compact, and also to simplify the construction thereof. Thus, it becomes possible to increase the productivity in the wafer manufacturing process and the assembling process of the semiconductor, and consequently to reduce the unit price of the power module. Moreover, this type of power module makes it possible effectively prevent heat generated by the switching semiconductor element from thermally conducting to the controlling IC, and consequently to prevent the controlling IC from malfunction. Therefore, it becomes possible to improve the reliability of the power module.

The power module of the fourth aspect of the present invention is provided with an insulating substrate having a base plate bonded to one of faces thereof and a circuit pattern formed on the other face as an electrode layer, the circuit pattern including: a switching semiconductor element, a free wheeling diode connected to the switching semiconductor element in anti-parallel therewith, and a controlling IC for controlling the switching semiconductor element, the switching semiconductor element, and in this arrangement, the switching semiconductor element and the free wheeling diode are constructed in a separated manner, and the free wheeling diode and the controlling IC are constructed as a monolithic integrated circuit.

In accordance with the power module of the fourth aspect of the present invention, the free wheeling diode and the controlling IC are constituted as a monolithic integrated circuit; therefore, it is possible to make the entire power module compact, and also to simplify the construction thereof. Thus, it becomes possible to increase the productivity in the wafer manufacturing process and the assembling process of the semiconductor, and consequently to reduce the unit price of the power module. Moreover, this type of power module makes it possible effectively prevent heat generated by the switching semiconductor element from thermally conducting to the controlling IC, and consequently to prevent the controlling IC from malfunction. Therefore, it becomes possible to improve the reliability of the power module.

The power module of the fifth aspect of the present invention, which relates to any one of the first aspect to the fourth aspect is characterized in that the switching semiconductor element is an insulating gate type element (for example, an IGBT, a power MOSFET, etc.).

In accordance with the power module of the fifth aspect of the present invention, an insulating gate type element (for example, an IGBT, a power MOSFET, etc.) is used as the switching semiconductor element. This makes it possible to use the power module at comparatively great operational frequencies.

DETAILED DESCRIPTION OF THE PREFERRED EMBODIMENTS

Embodiment 1

Figure 1:
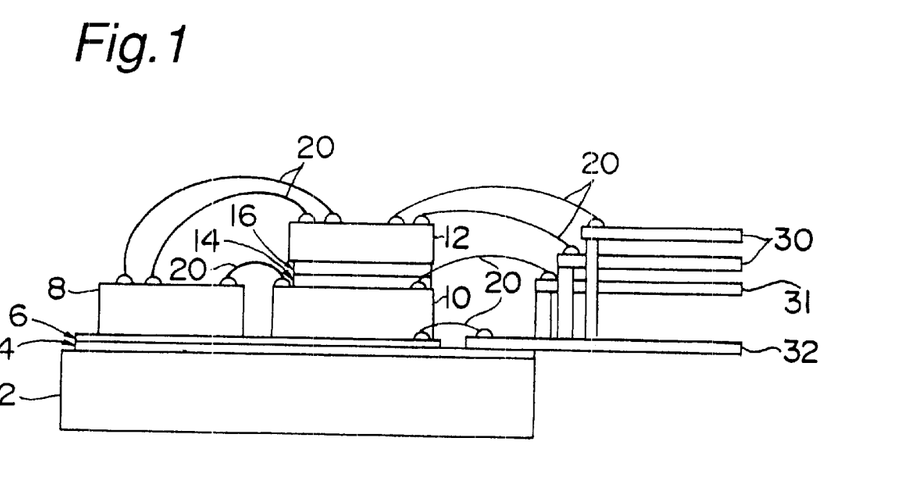
FIG. 1 is an explanatory drawing that explains the construction of a power module in accordance with Embodiment 1.

Referring to FIG. 1, the following description will discuss a power module in accordance with Embodiment 1 of the present invention.

FIG. 1 is an explanatory drawing that shows the construction of the power module of Embodiment 1. In FIG. 1, the power module is constituted by a heat sink 2 that is a base plate, an insulating substrate 4, an electrode layer 6 forming a circuit pattern, a switching semiconductor element 8, an FWDi 10 (Free Wheeling Diode), an insulating layer 14, a bonding agent layer 16, a controlling IC 12 for controlling the switching semiconductor element 8, a bonding wire 20, and an external input-output terminal 30 fixed to the insulating substrate 4, an emitter terminal 31 and a collector terminal 32.

The heat sink 2 is bonded to one of the faces of the insulating substrate 4. The insulating substrate 4 is preferably composed of a material having a high thermal conductivity so as to regulate the temperature of the power module as a whole. The electrode layer 6, which is placed on the other surface of the insulating substrate 4, forms a circuit pattern. In this circuit pattern, the switching semiconductor element 8 and the FWDi 10 are placed in a separated manner. The controlling IC 12 is electrically insulated from the FWDi 10 by the insulating layer 14, and is mechanically joined to the FWDi 10 by the bonding agent layer 16. The insulating layer 14 is composed of, for example, silicon nitride $Si_3N_4$, and the bonding agent layer 16 is composed of an insulating bonding agent. Here, since the controlling IC 12 is apart from the switching semiconductor element 8, the controlling IC 12 is less susceptible to malfunction due to heat generated by the switching semiconductor element The switching semiconductor element 8 allows a current to flow the FWDi 10 by a reverse electromotive force generated at the time of a switching operation through the bonding wire 20. The controlling IC 12 transmits a switching semiconductor driving output signal to the switching semiconductor element 8 through the bonding wire 20, and also receives detection signals of a current flowing through the switching semiconductor element 8 and a temperature thereof. The controlling IC 12 receives a switching semiconductor element driving input signal and a driving voltage from the external input-output terminal 30 through the bonding wire 20, and outputs a fail signal. Moreover, a voltage and a current are inputted to the electrode layer 6 from the collector terminal 32 through the bonding wire 20, and the voltage and the current are outputted to the emitter terminal 31 from the FWDi 10.

Here, the present embodiment has exemplified a case in which the switching semiconductor element 8 is an IGBT; and in the case when the switching semiconductor element 8 is an MOSFET, a source terminal 31 is used in place of the emitter terminal 31 and a drain terminal 32 is used in place of the collector terminal 32.

Next, the following description will discuss the switching semiconductor element, the FWDi and the controlling IC of the power module of the present invention.

Figure 5:
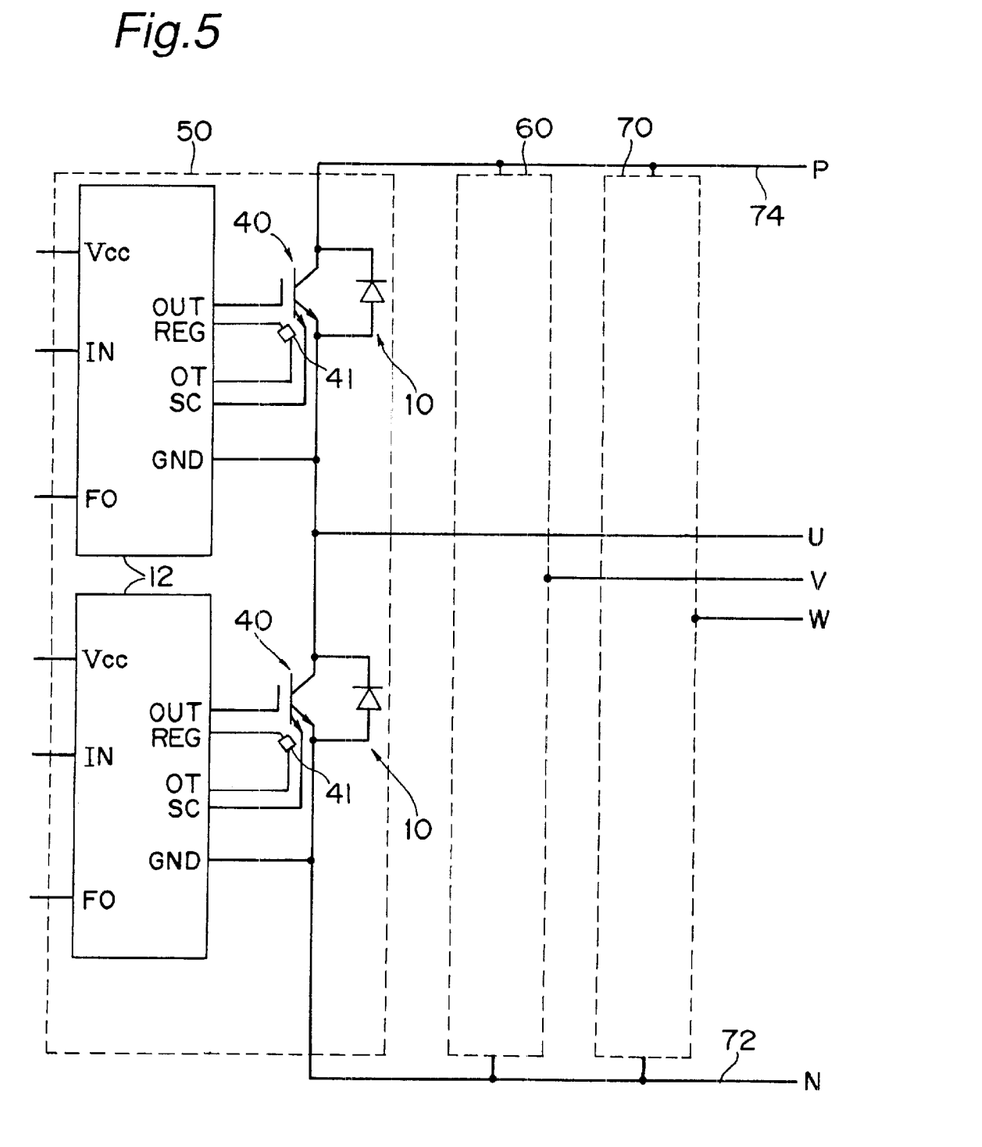
FIG. 5 is a circuit diagram that shows one portion of the power module.

FIG. 5 shows one example of a circuit diagram showing one portion of the power module including the switching semiconductor element 8, the FWDi 10 and the controlling IC 12. Here, in the present embodiment, as shown in FIG. 5, the IGBT 40 is used as the switching semiconductor element 8; however, any switching semiconductor element may be used as long as it can carry out a switching operation for converting DC to AC. For example, an insulation gate type element such as a power MOSFET may be used.

In FIG. 5, the constructions inside broken lines 60 and 70 are omitted; however, the constructions inside the two broken lines 60 and 70 are the same as the construction inside broken line 50. Broken line 50 includes two groups of constructions, each group consisting of an IGBT 40, an FWDi 10.connected to the IGBT 40 in anti-parallel therewith, a controlling IC 12 and a chip-temperature detection means 41. Broken lines 50, 60 and 70 constitute an inverter circuit. This inverter circuit is connected to the negative pole (N) 72 and the positive pole (P) 74 of a DC voltage derived from a direct current obtained by rectifying an AC power supply or derived from a battery, etc.

The controlling IC 12 receives a low voltage Vcc as a power supply for driving the controlling IC 12. The inverter circuit, which receives the DC voltage derived from a direct current obtained by rectifying an AC power supply or derived from a battery, etc., converts the direct current to a three phase (U-phase, V-phase and W-phase) alternating current having desired frequency and voltage by using the switching element driving output signal from the controlling IC 12, and supplies this to a motor (not shown), etc.

At this time, the controlling IC 12 receives the switching semiconductor element driving input signal through a switching semiconductor element driving input signal terminal IN, and in accordance with this driving input signal, sends a switching semiconductor element driving output signal from a switching semiconductor element driving output signal terminal OUT to the IGBT 40. This driving output signal allows the IGBT 40 to carry out switching operations so that it outputs a current with a voltage from the positive pole (P) 74 to the U-phase (V-phase, W-phase), or outputs a current with a voltage from the U-phase (V-phase, W-phase) to the negative pole (N) 72. The IGBT 40 inputs a current corresponding to, for example, one-thousandths of the current flowing through the IGBT 40 to a current detection input SC of the controlling IC 12 so that the current flowing through the IGBT 40 is monitored in a current detection circuit (normally, resistor)(not shown) inside the controlling IC 12. Upon detection of an abnormal current in the current detection circuit, the controlling IC 12 outputs the fail signal from the fail output terminal FO.

In the same manner, a chip-temperature detection means (diode, resistor, etc.) 41 for detecting the chip temperature is installed in the IGBT 40 so as to monitor the heat generation of the IGBT 40. Thus, upon detection of an abnormal temperature, the controlling IC 12 outputs the fail signal from the fail output terminal FO. In the chip-temperature detection means 41, as the IGBT 40 generates heat and its temperature changes, the value of resistivity changes. For this reason, for example, the current flowing through the chip-temperature detection means 41 is set to be constant so that detection can be made as to whether or not the temperature of the IGBT40 is abnormal by measuring the potential difference between the REG terminal and the OT terminal. Here, in FIG. 5, the IGBT 40 and the chip-temperature detection means 41 is depicted as if they were separated parts; however, in fact, the IGBT 40 and the chip-temperature detection means 41 is formed into one-chip semiconductor element.

Here, the emitter of the IGBT 40 is connected to the earth terminal GND of the controlling IC 20, and the voltage between the gate and emitter is given as a potential difference of the earth terminal GND and the switching semiconductor element driving output signal terminal OUT. The power MOSFET can be used at an operational frequency of approximately not more than 2 MHz, and the IGBT can be used at an operational frequency of approximately not more than 30 kHz.

Here, in order to prevent malfunction of the controlling IC 12 due to noise, the respective semiconductor devices are preferably placed in the power module so as to make wiring shorter.

As described above, in the power module in accordance with Embodiment 1, the switching semiconductor element 8 is placed on the FWDi 10 which hardly generates heat during operation; thus, it is possible to prevent malfunction in the controlling IC 12 due to heat generated by the switching semiconductor element 8. Therefore, it becomes possible to improve the reliability of the power module. Moreover, when the power module is constructed so as to make wiring shorter, it also becomes possible to reduce noise.

Embodiment 2

Figure 2:
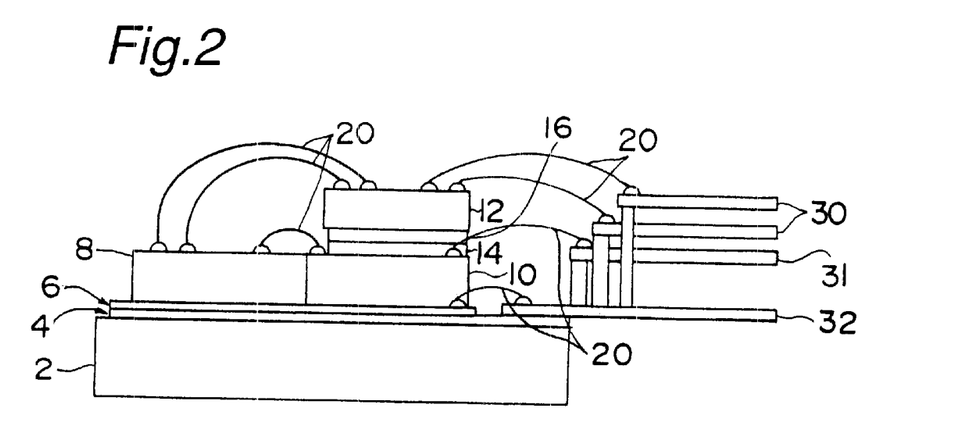
FIG. 2 is an explanatory drawing that explains the construction of a power module in accordance with Embodiment 2.

Referring to FIG. 2, the following description will discuss a power module in accordance with Embodiment 2 of the present invention.

FIG. 2 is an explanatory drawing that shows the construction of the power module of Embodiment 2.

In FIG. 2, the power module is constituted by a heat sink 2 that is a base plate, an insulating substrate 4, an electrode layer 6 forming a circuit pattern, a switching semiconductor element 8, an FWDi 10, an insulating layer 14, a bonding agent layer 16, a controlling IC 12 for controlling the switching semiconductor element 8, a bonding wire 20, and an external input-output terminal 30 fixed to the insulating substrate 4, an emitter terminal 31 and a collector terminal 32. Here, the present embodiment exemplifies a case in which the switching semiconductor element 8 is given as an IGBT; and in the case when the switching semiconductor element 8 is given as an MOS, a source terminal 31 is used in place of the emitter terminal 31, and a drain terminal 32 is used in place of the collector terminal 32.

Embodiment 2 is only different from Embodiment 1 in that the switching semiconductor element 8 and the FWDi 10 are constructed as a monolithic integrated circuit. With respect to those members and functions of Embodiment 2 that are the same as Embodiment 1, the description thereof is omitted. Since the controlling IC 12 is placed at a position apart from the switching semiconductor element 8, it is possible to reduce malfunction in the controlling IC 12 due to heat generated by the switching semiconductor element 8.

As described above, in the power module in accordance with Embodiment 2, the switching semiconductor element 8 and the FWDi 10 are constructed as a monolithic integrated circuit, and the controlling IC 12 is placed on the FWDi 10; thus, it becomes possible to make the entire power module more compact, and also to simplify the construction thereof. Therefore, it is possible to reduce the unit price of the power module. Moreover, it is possible to effectively prevent heat generated by the switching semiconductor element 8 from thermally conducting to the controlling IC, and consequently to prevent the controlling IC 12 from malfunction. Therefore, it becomes possible to improve the reliability of the power module. Moreover, when the power module is constructed so as to make wiring shorter, it also becomes possible to reduce noise.

Embodiment 3

Figure 3:
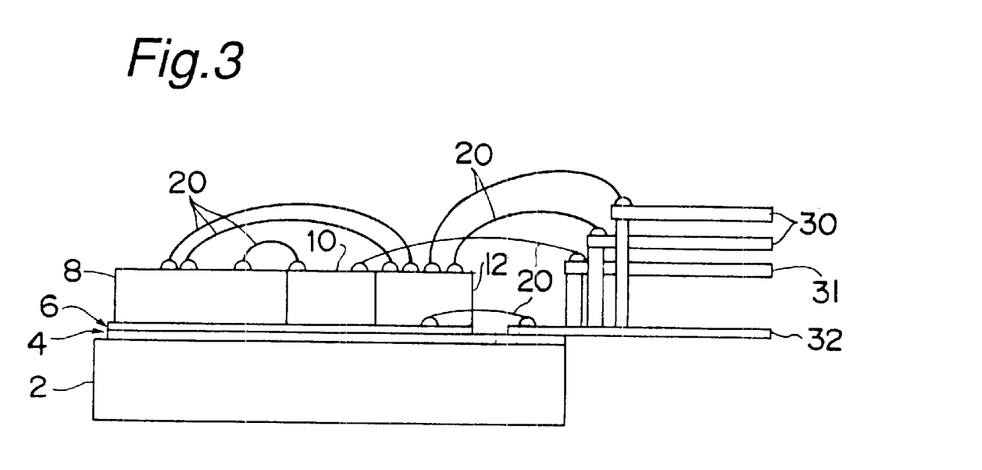
FIG. 3 is an explanatory drawing that explains the construction of a power module in accordance with Embodiment 3.

Referring to FIG. 3, the following description will discuss a power module in accordance with Embodiment 3 of the present invention.

FIG. 3 is an explanatory drawing that shows the construction of the power module of Embodiment 3. In FIG. 3, the power module is constituted by a heat sink 2 that is a base plate, an insulating substrate 4, an electrode layer 6 forming a circuit pattern, a switching semiconductor element 8, an FWDi 10, a controlling IC 12 for controlling the switching semiconductor element 8, a bonding wire 20, and an external input-output terminal 30 fixed to the insulating substrate 4, an emitter terminal 31 and a collector terminal 32.

The heat sink 2 is bonded to one of the faces of the insulating substrate 4. The electrode layer 6, which is placed on the other surface of the insulating substrate 4, forms a circuit pattern. In this circuit pattern, the switching semiconductor element 8, the FWDi 10 and the controlling IC 12 are constructed into a monolithic integrated circuit, and at least one portion of the FWDi 10 is sandwiched between the switching semiconductor element 8 and the controlling IC 12. Here, the controlling IC 12 is not in contact with the switching semiconductor element 8. Since the controlling IC 12 is placed at a position apart from the switching semiconductor element 8, it is possible to reduce malfunction in the controlling IC 12 due to heat generated by the switching semiconductor element 8. Here, in order to prevent malfunction of the controlling IC 12 due to noise, the respective semiconductor devices are preferably placed in the power module so as to make wiring shorter.

The switching semiconductor element 8 is connected to the FWDi 10 through bonding wire 20, and is also connected to the controlling IC 12 through another bonding wire 20. The controlling IC 12 is connected to the switching semiconductor element 8 through bonding wire 20, and is also connected to the external input-output terminal 30 through another bonding wire 20. The FWDi 10 is connected to the switching semiconductor element 8 through bonding wire 20, and is also connected to the emitter terminal 31 through another bonding wire 20. The electrode layer 6 is connected to the collector terminal 32 through bonding wire 20.

In this case, the switching semiconductor element 8 is given as an IGBT; and in the case when the switching semiconductor element 8 is given as an MOS, a source terminal 31 is used in place of the emitter terminal 31, and a drain terminal 32 is used in place of the collector terminal 32.

Next, an explanation will be given of the operation of the power module.

The controlling IC 12 receives a low voltage as a power supply through the external input-output terminal 30. The controlling IC 12 receives a switching semiconductor element driving input signal through the external input-output terminal 30, and in accordance with this input signal, sends a switching semiconductor element driving output signal to the switching semiconductor element 8. This driving output signal allows the switching semiconductor element 8 to carry out switching operations so that it outputs a current with a voltage inputted from the collector terminal 32 through the electrode layer 6 to the emitter terminal 31 through the FWDi 10. At this time, a current is allowed to flow through the FWDi 10 by a reverse electromotive force generated at the time of a switching operation.

The switching semiconductor element 8 inputs a current corresponding to, for example, one-thousandths of the current flowing through the switching semiconductor element 8 to the controlling IC 12 so that the current flowing through the switching semiconductor element is monitored in a current detection circuit (normally resistor) (not shown) inside the controlling IC 12. Upon detection of an abnormal current in the current detection circuit, the controlling IC 12 outputs a fail signal to the external input-output terminal 30. In the same manner, a chip-temperature detection means (diode, resistor, etc.) 41 for detecting the chip temperature is installed in the IGBT 40 so as to monitor the heat generation of the IGBT 40. Thus, upon detection of an abnormal temperature, the controlling IC 12 outputs the fail signal from the fail output terminal FO. With respect to detailed operations of the power module, since they have been discussed in Embodiment 1, the description thereof is omitted in order to avoid duplicated descriptions.

As described above, the power module in accordance with Embodiment 3 has an arrangement in which the switching semiconductor element 8, the FWDi 10 and the controlling IC 12 are constituted as a monolithic integrated circuit in a manner so as to allow at least one portion of the FWDi 10 to be sandwiched between the switching semiconductor 8 and the controlling IC 12; thus, it becomes possible to make the entire power module compact, and to simplify the construction thereof. Therefore, it becomes possible to reduce the unit price of the power module. Moreover, it is possible to effectively prevent heat generated by the switching semiconductor element 8 from thermally conducting to the controlling IC, and consequently to prevent the controlling IC 12 from malfunction. Therefore, it becomes possible to improve the reliability of the power module. Moreover, when the power module is constructed so as to make wiring shorter, it also becomes possible to reduce noise.

Embodiment 4

Figure 4:
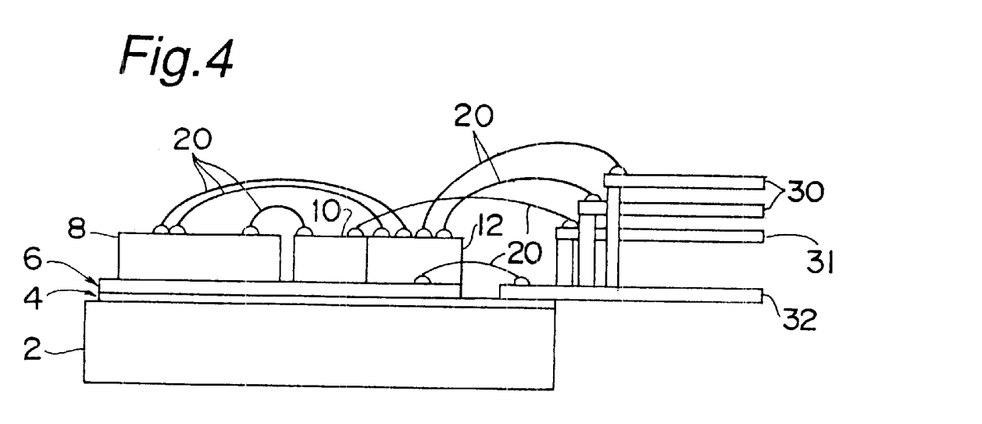
FIG. 4 is an explanatory drawing that explains the construction of a power module in accordance with Embodiment 4.

Referring to FIG. 4, the following description will discuss a power module in accordance with Embodiment 4 of the present invention.

FIG. 4 is an explanatory drawing that shows the construction of the power module of Embodiment 4. In FIG. 4, the power module is constituted by a heat sink 2 that is a base plate, an insulating substrate 4, an electrode layer 6 forming a circuit pattern, a switching semiconductor element 8, an FWDi 10, a controlling IC 12 for controlling the switching semiconductor element 8, a bonding wire 20, and an external input-output terminal 30 fixed to the insulating substrate 4, an emitter terminal 31 and a collector terminal 32.

Embodiment 4 is similar to Embodiment 3 in many points. However, in Embodiment 3, the switching semiconductor element 8, the FWDi 10 and the controlling IC 12 are constituted as a monolithic integrated circuit; in contrast, in Embodiment 4, the switching semiconductor element 8 and the FWDi 10 are constructed in a separated manner, and the free wheeling diode and the controlling IC are constituted as a monolithic integrated circuit. In other words, Embodiment 3 and Embodiment 4 are distinct from each other as to whether or not the switching semiconductor element 8 and the FWDi 10 are placed in a separated manner. Here, with respect to the same points as in Embodiment 2, the description thereof is omitted in order to avoid duplicated descriptions, Since the controlling IC 12 is located at a position apart from the switching semiconductor element 8, it is possible to reduce malfunction in the controlling IC 12 due to heat generated by the switching semiconductor element 8.

As described above, since the switching semiconductor element 8 and the FWDi 10 are constructed in a separated manner, and since the free wheeling diode and the controlling IC are constituted as a monolithic integrated circuit, this construction makes it possible to miniaturize the entire power module, and to simplify the construction thereof. Thus, it becomes possible to reduce the unit price of the power module. Moreover, it is possible to effectively prevent heat generated by the switching semiconductor element 8 from thermally conducting to the controlling IC, and consequently to prevent the controlling IC 12 from malfunction. Therefore, it becomes possible to improve the reliability of the power module. Moreover, when the power module is constructed so as to make wiring shorter, it also becomes possible to reduce noise.

Here, each of the above-mentioned Embodiments has a Single-in-Line terminal arrangement in which the input-output terminals, collector terminal and emitter terminal are located at one end of the power module; however, the present invention is not intended to be limited by this arrangement, and a Dual-in-Line arrangement in which the input-output terminals are located at one end of the power module and the collector terminal and emitter terminal are located at the other end may be adopted.

What is claimed is:

1. A power module comprising:
    an insulating substrate having a base plate bonded to a face thereof and a circuit pattern formed on another face as an electrode layer, the circuit pattern including,
        a switching semiconductor element,
        a free wheeling diode connected to the switching semiconductor element in anti-parallel therewith, and
        a controlling IC configured to control the switching semiconductor element,
            wherein the controlling IC is mounted on the free wheeling diode and separated from the switching semiconductor element by the free wheeling diode.

2. The power module according to claim 1, wherein the switching semiconductor element is an insulating gate element including at least one of an IGBT and a power MOSFET.

3. The power module according to claim 1, wherein the switching semiconductor element and the free wheeling diode are formed together as a monolith.

4. The power module according to claim 3, wherein the switching semiconductor element is an insulating gate element including at least one of an IGBT and a power MOSFET.

5. A power module comprising:
    an insulating substrate having a base plate bonded to a face thereof and a circuit pattern formed on another face as an electrode layer, the circuit pattern including,
        a switching semiconductor element,
        a free wheeling diode connected to the switching semiconductor element in anti-parallel therewith, and
        a controlling IC configured to control the switching semiconductor element,
            wherein the free wheeling diode, the switching semiconductor element, and the controlling IC are formed together as a monolith with at least one portion of the free wheeling diode being sandwiched between and separating the switching semiconductor element from the controlling IC.

6. The power module according to claim 5, wherein the switching semiconductor element is an insulating gate element including at least one of an IGBT and a power MOSFET.

7. A power module comprising:
    an insulating substrate having a base plate bonded to a face thereof and a circuit pattern formed on another face as an electrode layer, the circuit pattern including,
        a switching semiconductor element,
        a free wheeling diode connected to the switching semiconductor element in anti-parallel therewith, and
        a controlling IC configured to control the switching semiconductor element,
            wherein the switching semiconductor element and the free wheeling diode are separated, and the free wheeling diode and the controlling IC are formed together as a monolith and separated as a unit from the switching semiconductor element.

8. The power module according to claim 7, wherein the switching semiconductor element is an insulating gate element including at least one of an IGBT and a power MOSFET.

* * * * *

UNITED STATES PATENT AND TRADEMARK OFFICE
CERTIFICATE OF CORRECTION

PATENT NO. : 6,529,062 B2
DATED : March 4, 2002
INVENTOR(S) : Gourab Majumdar et al.

It is certified that error appears in the above-identified patent and that said Letters Patent is hereby corrected as shown below:

<u>Title page,</u>
Item [56], References Cited, FOREIGN PATENT DOCUMENTS, insert:
--      1006578 A2    6/07/2000     Europe
        41 24 757 C2   7/30/1992     Germany --

Signed and Sealed this

Fifteenth Day of July, 2003

JAMES E. ROGAN
*Director of the United States Patent and Trademark Office*